United States Patent
Jeon et al.

(10) Patent No.: US 9,844,168 B2
(45) Date of Patent: Dec. 12, 2017

(54) COOLING SYSTEM FOR POWER CONVERSION DEVICE

(75) Inventors: Wooyong Jeon, Seoul (KR); Joon Hwan Kim, Seoul (KR); Minji Kim, Hwaseong (KR)

(73) Assignee: Hyundai Motor Company, Seoul (KR)

( * ) Notice: Subject to any disclaimer, the term of this patent is extended or adjusted under 35 U.S.C. 154(b) by 890 days.

(21) Appl. No.: 13/566,242

(22) Filed: Aug. 3, 2012

(65) Prior Publication Data
US 2013/0146254 A1 Jun. 13, 2013

(30) Foreign Application Priority Data
Dec. 9, 2011 (KR) .................. 10-2011-0132229

(51) Int. Cl.
| B60H 1/00 | (2006.01) |
| H05K 7/20 | (2006.01) |
| H01L 23/473 | (2006.01) |
| F28D 21/00 | (2006.01) |

(52) U.S. Cl.
CPC ....... *H05K 7/20927* (2013.01); *H01L 23/473* (2013.01); *F28D 2021/0029* (2013.01); *H01L 2924/0002* (2013.01)

(58) Field of Classification Search
CPC .......... H05K 7/20927; H05K 7/20218; H05K 7/20254; H05K 7/1432; H01L 23/46; H01L 23/40; H01L 23/473; F28D 2021/0028; F28D 2021/0029
USPC ............... 165/41, 104.33; 361/698
See application file for complete search history.

(56) References Cited

U.S. PATENT DOCUMENTS

| 7,710,723 B2* | 5/2010 | Korich et al. ............... 361/699 |
| 2005/0018386 A1* | 1/2005 | Beihoff et al. ............... 361/676 |
| 2011/0042038 A1* | 2/2011 | Herron et al. ........... 165/104.11 |
| 2011/0073292 A1* | 3/2011 | Datta et al. .................. 165/157 |

FOREIGN PATENT DOCUMENTS

| CN | 1993030 A | 7/2007 |
| CN | 101355292 A | 1/2009 |
| CN | 101997401 a | 3/2011 |
| JP | H11-126870 A | 5/1999 |
| JP | 2002-164490 A | 6/2002 |
| JP | 2003-234589 A | 8/2003 |

(Continued)

*Primary Examiner* — Len Tran
*Assistant Examiner* — Jon T Schermerhorn
(74) *Attorney, Agent, or Firm* — Mintz Levin Cohn Ferris Glovsky and Popeo, P.C.; Peter F. Corless (57) ABSTRACT

Disclosed is a cooling system for a conversion device that includes a heat sinking plane, a main cooling jacket, and a sub-cooling jacket. The main cooling jacket is connected with the heat sinking plane and provided with a first component disposed thereto. The sub cooling jacket is connected with the heat sinking plane on the opposite side of the main cooling jacket, and provided with a second component which generates a relatively lower amount of heat than the first component. A main inlet is disposed in the main cooling jacket for supplying coolant to the main cooling jacket, and an outlet is disposed in the sub cooling jacket for exhausting the coolant which has passed through the sub cooling jacket. A sub inlet is formed in the heat sinking plane for the coolant passing through the main cooling jacket to be supplied to the sub cooling jacket.

15 Claims, 7 Drawing Sheets

(56) References Cited

FOREIGN PATENT DOCUMENTS

| | | |
|---|---|---|
| JP | 2003273302 A | 9/2003 |
| JP | 2006-196766 A | 7/2006 |
| JP | 2007036214 A | 2/2007 |
| JP | 2007-201181 A | 8/2007 |
| JP | 2006-198981 a | 8/2008 |
| JP | 2008251932 A | 10/2008 |
| JP | 2009-278089 A | 11/2009 |
| JP | 2010-245158 A | 10/2010 |
| JP | 2011-017516 A | 1/2011 |
| KR | 10-0765660 | 10/2007 |

* cited by examiner

COOLING SYSTEM FOR POWER CONVERSION DEVICE

CROSS-REFERENCE TO RELATED APPLICATION

This application claims priority to and the benefit of Korean Patent Application No. 10-2011-0132229 filed in the Korean Intellectual Property Office on Dec. 9, 2011, the entire contents of which are incorporated herein by reference.

BACKGROUND OF THE INVENTION (a) Field of the Invention

The present invention relates to a cooling system for a conversion device. More particularly, the present invention relates to a cooling system for a conversion device, for example an inverter system, which may be applied to a hybrid vehicle or an electric vehicle to cool components.

(b) Description of the Related Art

Recently, through the increasing interesting in green energy, hybrid vehicles, electric vehicles, fuel cell vehicles and so on have begun to replace the internal combustion engine vehicle. Most of these environmentally friendly vehicles include an electric motor that includes a permanent magnet. The electric motor is driven by phase current which is supplied by an inverter through a power cable. The phase current is converted from DC voltage into 3-phase AC voltage according to a PWM (Pulse Width Modulation) signal from a controller.

The inverter system includes a power module that includes an IGBT (Insulated Gate Bipolar Transistor), a capacitor module absorbing ripple current by switching of a switching element, an inductor driving a motor or filtering output voltage and so on. These constituent elements create heat when the inverter system is being operated. In particular, switching elements such as the power module produce an excessive amount of heat and other core components, such as an inductor, produce relatively little heat.

In the conventional art, a heat sink is usually applied to the aide in cooling these components. In this case, since the components are mounted to both upper and lower surfaces of the heat sink, the heat sink cools the components indirectly by coolant flowing through cooling lines.

However, in a conventional art, since the components vary in the amount of heat that is generated therein, are mounted to an upper and lower surface of the heat sink, and are cooled, the cooling efficiency of the components of the inverter system may be deteriorated.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a cooling system for a conversion device such as an inverter system which may be applied to a hybrid vehicle or an electric vehicle to cool components efficiently.

A cooling system for a conversion device according to an exemplary embodiment of the present invention may include a heat sinking plane, a main cooling jacket connected with the heat sinking plane and provided with a first component disposed thereto, a sub cooling jacket connected with the heat sinking plane on the opposite side of the main cooling jacket, and provided with a second component which produces relatively lower heat generation than that of the first component, a main inlet which is disposed in the main cooling jacket for supplying coolant to the main cooling jacket, and an outlet which is disposed in the sub cooling jacket for exhausting the coolant which has passed through the sub cooling jacket. A sub inlet is formed in the heat sinking plane to allow the coolant passing through the main cooling jacket to be supplied to the sub cooling jacket.

The main cooling jacket and the heat sinking plane may define a main cooling path therebetween, and the first component may directly contact the coolant flowing through the main cooling path. Furthermore, an open aperture may be formed in the main cooling jacket for the first component to directly contact the coolant.

The cooling system may further include a first cooling pin formed to the first component, wherein the first cooling pin may directly contact the coolant through the open aperture. The sub cooling jacket and the heat sinking plane may define a sub cooling path therebetween. The sub cooling path may communicate the sub inlet with the outlet and may be formed as "U" shape and include a first space communicated with the sub inlet and a second space communicated with the outlet. The sub cooling path may further include a plurality of channels connecting the first space and the second space.

The cooling system may further include a turbulator formed in at least part of the plurality of channels. Heat interface material may be interposed between the sub cooling jacket and the second component. The heat interface material may be a thermal pad or thermal grease.

The cooling system may further include a second cooling pin formed to the second component. In some exemplary embodiments, the conversion device may include an inverter or a converter for a vehicle. The first component may include a kind of switching element; and the second component may include a kind of core element.

A cooling system for a conversion device according to exemplary embodiment of the present invention may include a heat sinking plane, a main cooling jacket connected with the heat sinking plane and provided with a first component disposed thereto, a sub cooling jacket connected with the heat sinking plane on the opposite side of the main cooling jacket, and provided with a second component which produces relatively lower heat generation than that of the first component, a main inlet which is disposed in the main cooling jacket for supplying coolant to the main cooling jacket, and an outlet which is disposed in the sub cooling jacket for exhausting the coolant which has passed through the sub cooling jacket. A sub inlet may be formed in the heat sinking plane for the coolant passing through the main cooling jacket to be supplied to the sub cooling jacket. Additionally, the main cooling jacket and the heat sinking plane may define a main cooling path therebetween, the first component may directly contact the coolant flowing through the main cooling path, and the sub cooling jacket and the heat sinking plane may define a sub cooling path therebetween.

An open aperture may be formed to the main cooling jacket for the first component to directly contact the coolant, a first cooling pin may be formed to protrude from the first component, and the first cooling pin may directly contact the coolant through the open aperture.

The sub cooling path may communicate the sub inlet with the outlet and may be formed in a "U" shape. The sub cooling path may include a first space communicated with the sub inlet, and a second space communicated with the outlet.

The sub cooling path may further include a plurality of channels connecting the first space and the second space and a turbulator may be formed in at least part of the plurality of channels.

Advantageously, according to an exemplary embodiment of the present invention, components producing relatively high heat generation are cooled directly by the main cooling jacket and components producing relatively low heat generation are cooled indirectly by a sub cooling jacket. So, in an exemplary embodiment of the present invention, direct and indirect cooling may be utilized to cool the components in the conversion system based on their associated amount of heat generation, thus an efficient design of a conversion device may be realized. Due to efficient cooling of the components, operation performance of the conversion device may be improved through efficient element disposition and a reduction of the overall size of the conversion device.

BRIEF DESCRIPTION OF THE DRAWINGS

The drawings illustrate exemplary embodiments of the present invention and are not construed to limit any aspect of the invention.

DESCRIPTION OF SYMBOLS

1: first component
2: second component
5: first cooling pin
7: second cooling pin
10: cooling module
20: main cooling jacket
21: main cooling path
23: main inlet
25: open aperture
40: sub cooling jacket
41: sub cooling path
43: outlet
45a: first space
45b: second space
45c: channel
45d: turbulator
60: heat sinking plane
61: sub inlet
71: heat interface material

DETAILED DESCRIPTION OF THE EMBODIMENTS

Hereinafter, the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum).

Although the below exemplary embodiment is described as using a plurality of units to perform the above process, it is understood that the above processes may also be performed by a single controller or unit.

Furthermore, the control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Description of components that are not necessary for explaining the present invention will be omitted, and the same constituent elements are denoted by the same reference numerals in this specification. In addition, size and thickness of components shown in the drawings may be differ from real size and real thickness of the components for better comprehension and ease of description. Therefore, the present invention is not limited to those shown in the drawings.

Figure 1:
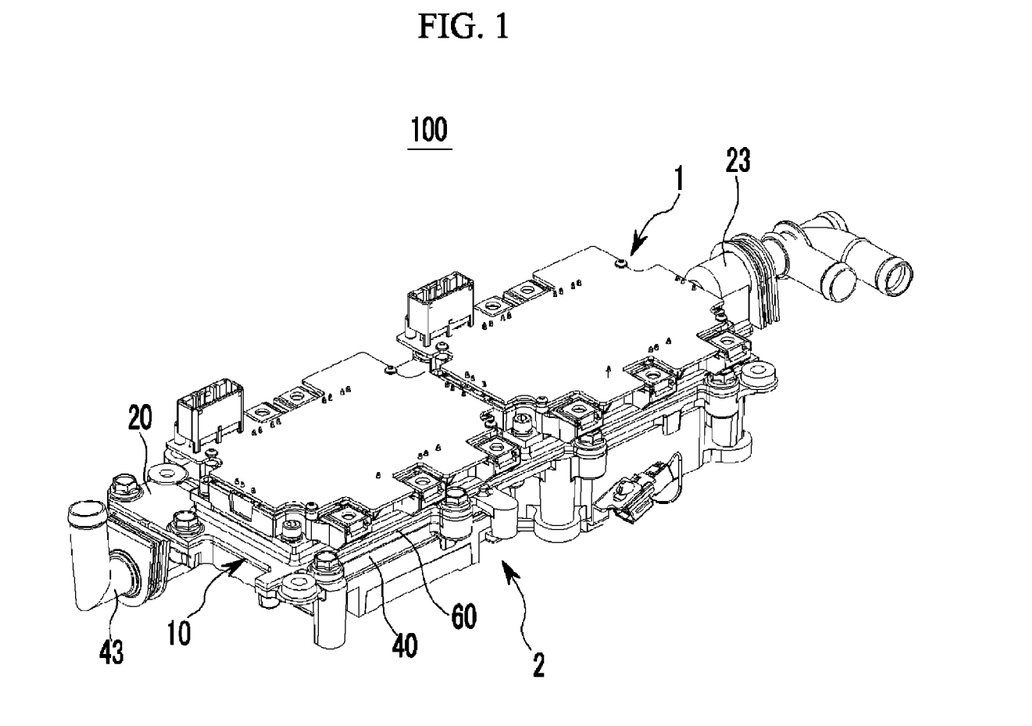
FIG. 1 is a perspective view of a cooling system for a conversion device according to an exemplary embodiment of the present invention.

FIG. 1 is a perspective view of a cooling system for a conversion device according to an exemplary embodiment of the present invention. Referring to FIG. 1, a cooling system for a conversion device 100 according to an exemplary embodiment of the present invention may be applied to a hybrid vehicle provided with an engine and a high power motor as power sources, an electric vehicle, a fuel cell vehicle and so on. However, in an exemplary embodiment of the present invention, a hybrid vehicle and an electric vehicle may be described as examples.

In the exemplary embodiment of the present invention, the cooling system 100 is configured to cool a conversion device of a hybrid or electric vehicle.

The conversion device includes an inverter and a converter, and a motor is driven by phase current which is supplied by the inverter through a power cable. The phase current is converted from DC voltage into 3-phase (U, V and W) AC voltage according to a PWM (Pulse Width Modulation) signal of a controller. In the specification, the converter is described as the conversion device for exemplary purposes only.

The inverter system may include switching elements such as a power module and core elements such as an inductor, a transformer, a choke and so on. During the operation of the inverter system, the switching elements produce a relatively high amount of heat and the core elements produce a relatively low amount of heat. That is, the inverter system includes components which generate various amounts of heat. Since the inverter systems are well known in the art and the illustrative embodiment of the present invention may be interchangeable applied to any one of those inverter systems, a description of an inverter system has been omitted for brevity.

In the exemplary embodiment of the present invention, the switching elements which generate a relatively high amount of heat will be called as a first component 1 for convenience. And in the exemplary embodiment of the present invention, the core elements which generate a relatively low amount of heat will be called as a second component 2 for convenience.

The cooling system for a conversion device 100 according to an exemplary embodiment of the present invention may enhance cooling efficiency of the first and the second components 1 and 2 which each generate various amounts of heat so that performance of the conversion device may be improved.

In an exemplary embodiment of the present invention, the cooling system for a conversion device 100 may cool the first and the second components 1 and 2 directly or indirectly according the amount of heat generated by that component, thus efficient design of the conversion device may be realized. Furthermore, in the exemplary embodiment of the present invention, the components 1 and 2 with various heat generations are cooled by coolant from a cooling module and thus efficient element disposition and size reduction of the conversion device may be realized. Furthermore, the first and the second component 1 and 2 with various heat generations are mounted in the cooling system for a conversion device 100 and the coolant flows within the cooling module 10 to cool the first and the second component 1 and 2.

At least one first component 1 is mounted on one side of the cooling module 10, and at least one second component 2 is mounted on the other side thereof. The cooling module 10 may directly cool the first component 1 and indirectly cool the second component 2.

Figure 2:
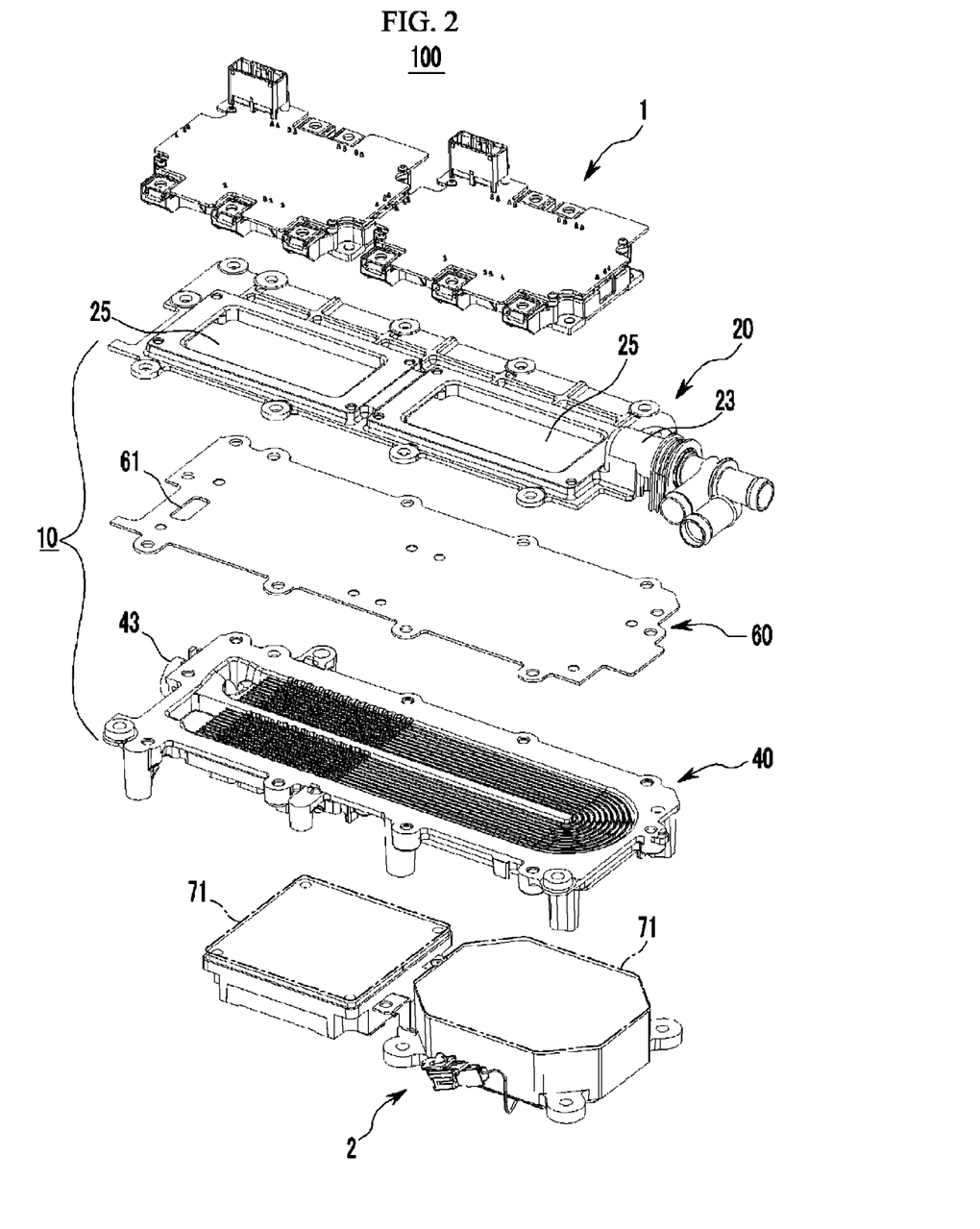
FIG. 2 and FIG. 3 are exploded perspective views of FIG. 1.
Figure 3:
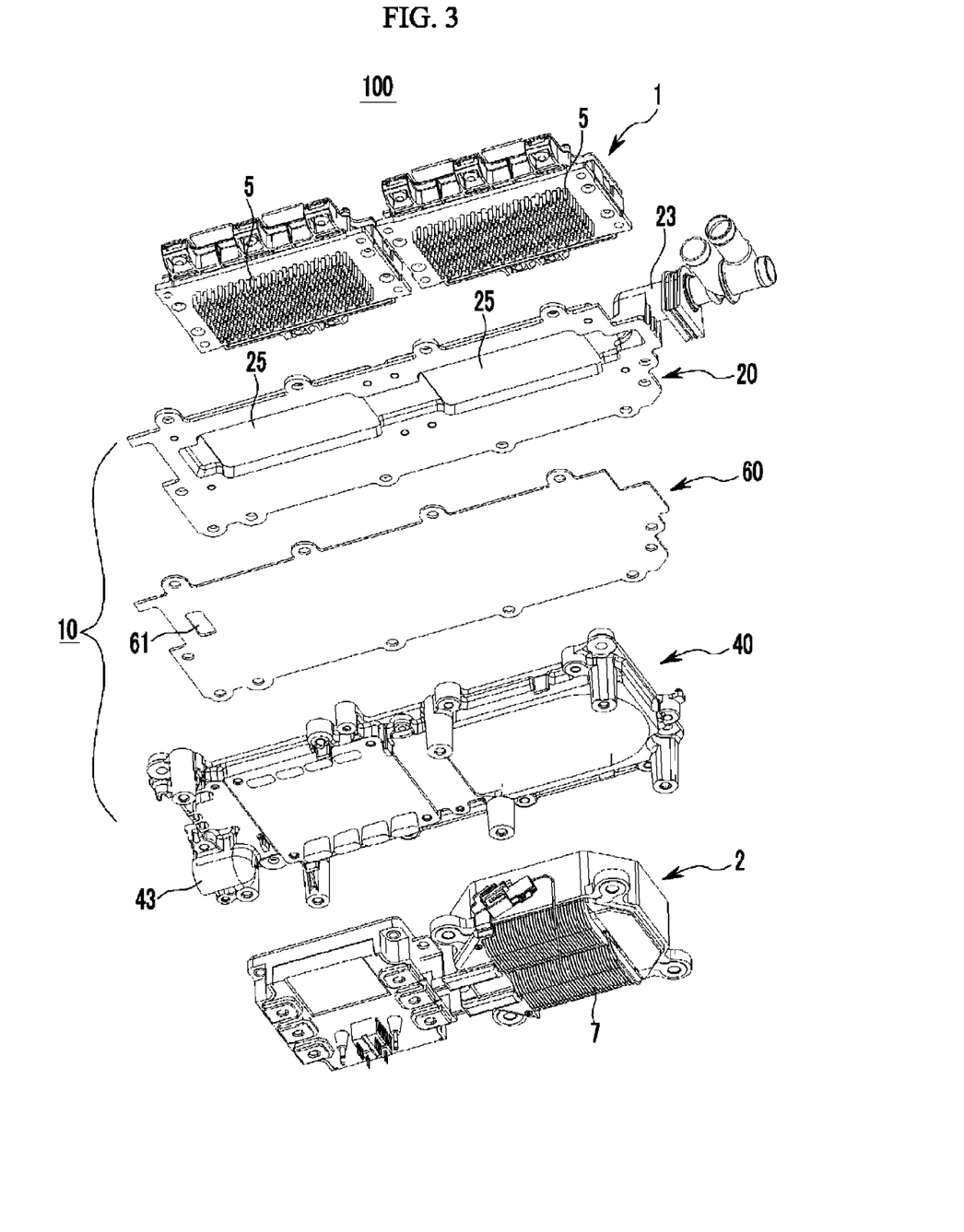
Figure 4:
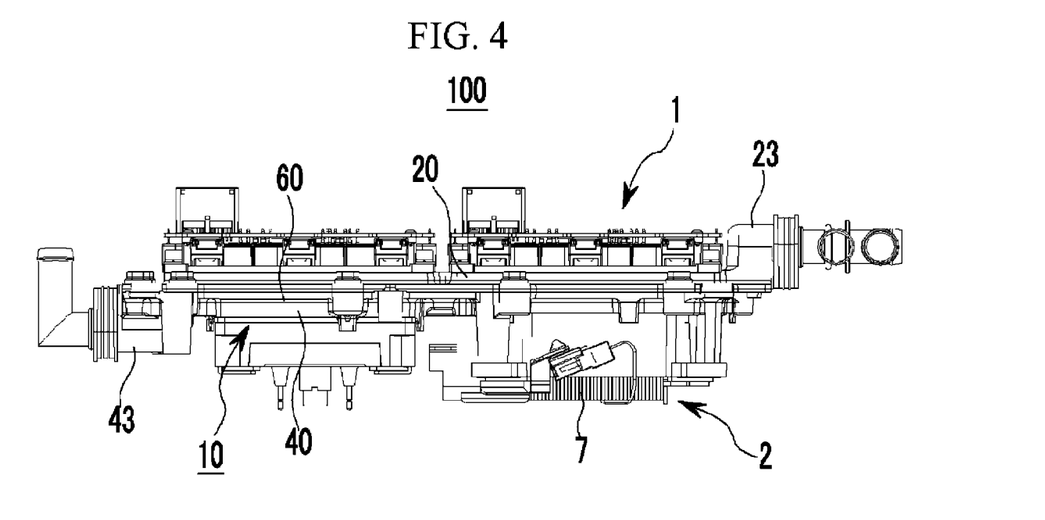
FIG. 4 is a front view of FIG. 1.
Figure 5:
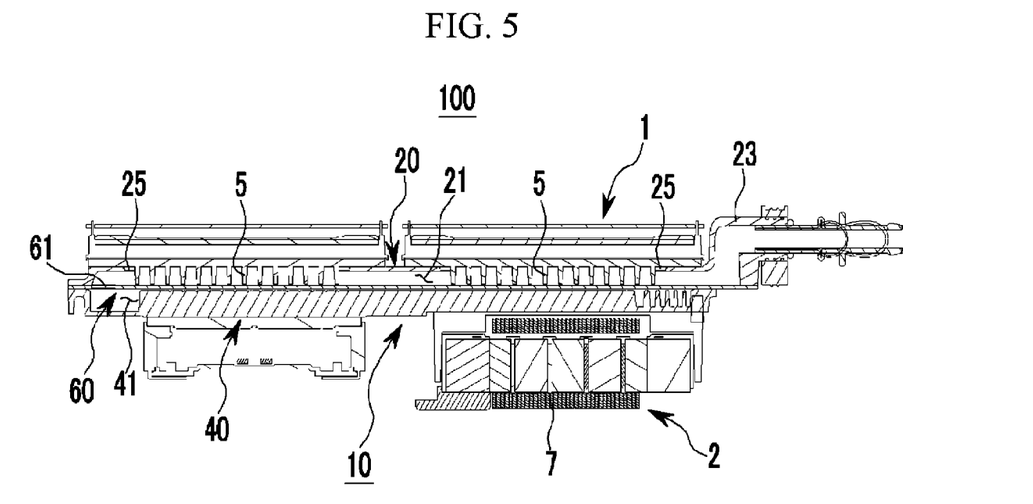
FIG. 5 is a cross-sectional view of FIG. 1.

FIG. 2 and FIG. 3 are exploded perspective views of FIG. 1, FIG. 4 is a front view of FIG. 1, and FIG. 5 is a cross-sectional view of FIG. 1.

Referring to FIG. 1 through FIG. 5, the cooling module 10 according to an exemplary embodiment of the present invention includes a main cooling jacket 20, a sub cooling jacket 40 and a heat sinking plane 60. The main cooling jacket 20 and the sub cooling jacket 40 are disposed on each side of the heat sinking plane 60 in a layered sequence.

In the drawing, the main cooling jacket 20 is disposed on an upper portion of the heat sinking plane 60 and the sub cooling jacket 40 is disposed on a lower portion of the heat sinking plane 60. The main cooling jacket 20 and the heat sinking plane 60 define a main cooling path 21 (referring to FIG. 5) where coolant flows.

Figure 6:
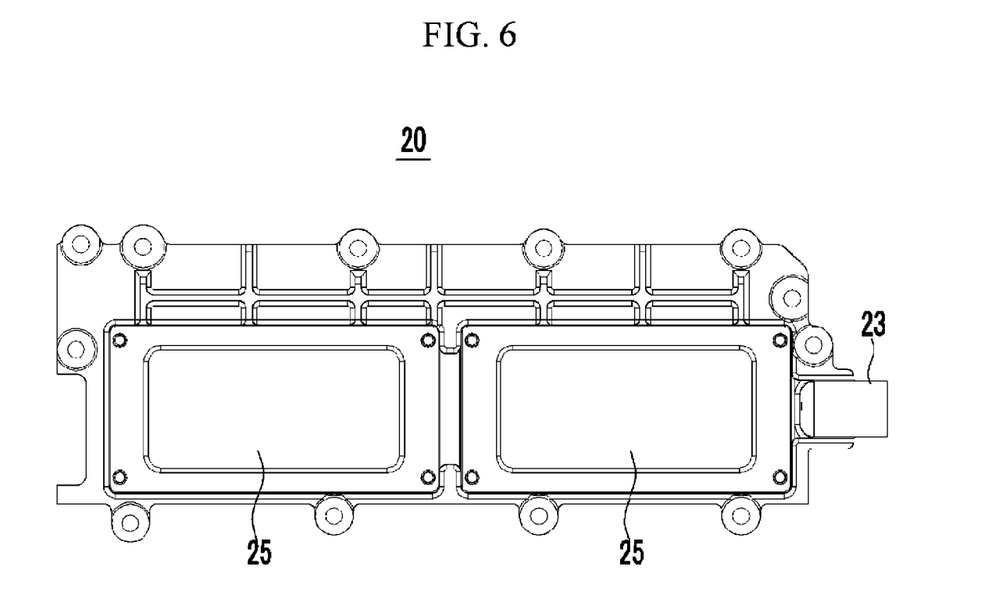
FIG. 6 is a plan view of a main cooling jacket applied to a cooling system for a conversion device according to an exemplary embodiment of the present invention.

The main cooling jacket 20, as shown in FIG. 6, is provided with a main inlet 23 mounted thereto for the coolant to flow into the main cooling path 21 and an open aperture 25 is formed to the main cooling jacket 20. The first component 1 may be in direct contact with the coolant through the open aperture 25.

At lower portion of the first component 1, a plurality of the first cooling pins 5 (referring to FIG. 3 and FIG. 5) are formed thereto, and the first cooling pins 5 may be in direct contact with the coolant flowing within the main cooling path 21 through the open aperture 25. Since the first cooling pins 5 of the first component 1 are disposed in the main cooling path 21 through the open aperture 25, the coolant flowing though the main cooling path 21 comes in direct contact with the first cooling pins 5 so that the first component 1 may be cooled directly.

The sub cooling jacket 40 is disposed in a lower portion of the heat sinking plane 60, and defines a sub cooling path 41 (referring to FIG. 5) with the heat sinking plane 60. The sub cooling jacket 40 is formed in a "U" shape, and the sub cooling path 41 may be communicated with the main cooling path 21 of the main cooling jacket 20 through the heat sinking plane 60.

In the heat sinking plane 60, a sub inlet 61 for the coolant flowing through the main cooling path 21 to be supplied to the sub cooling path 41 is formed thereto. Additionally, an outlet 43 is formed in the sub cooling jacket 40 for the coolant flowing though the main cooling path 21, the sub inlet 61 and the sub cooling path 41 sequentially to be exhausted.

Figure 7:
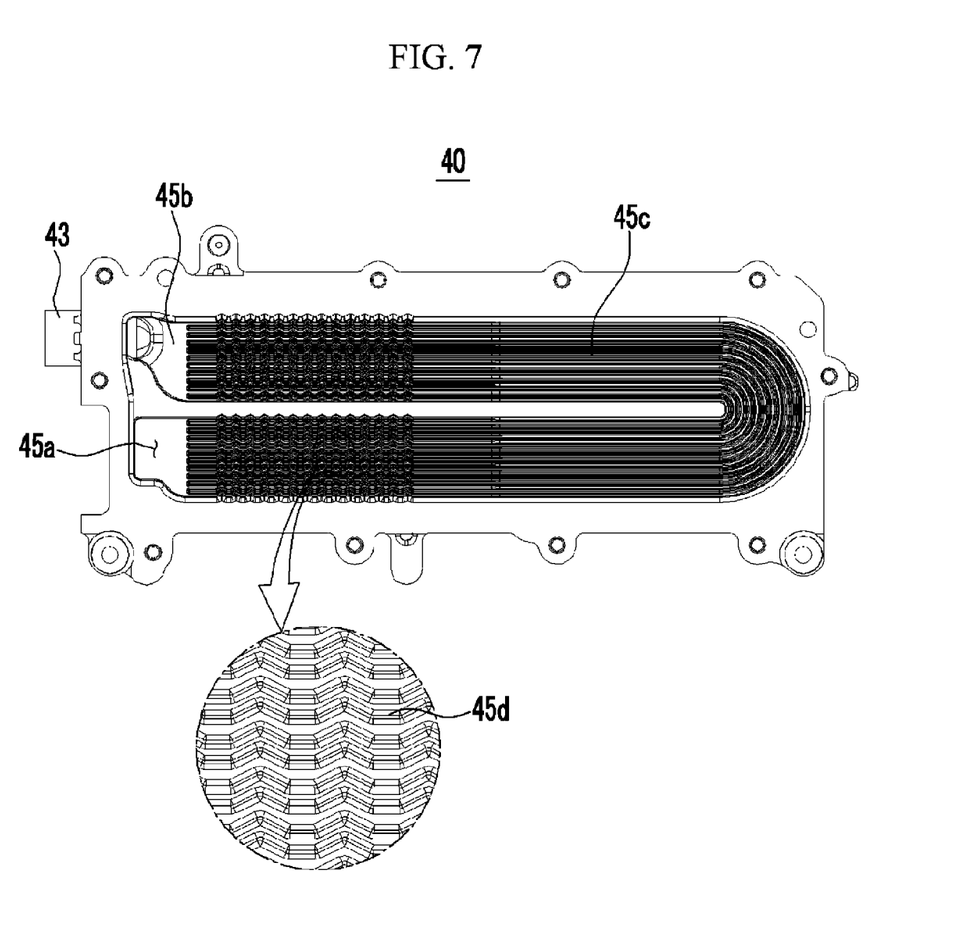
FIG. 7 is a plan view of a sub cooling jacket applied to a cooling system for a conversion device according to an exemplary embodiment of the present invention.

The sub cooling path 41, as shown in FIG. 7, includes a first space 45a communicated with sub inlet 61, a second space 45b communicated with the outlet 43, and a plurality of channels 45c connecting the first space 45a and the second space 45b. The channels 45c form a coolant path formed in a "U" shape pattern, and the initial point of the coolant path is connected with the first space 45a and an end point of the coolant path is connected with the second space 45b. In at least part of the plurality of channels 45c, a turbulator 45d formed in the shape of a wave or zigzag pattern is formed therein. The turbulator 45d may increase contact area of channels 45c and thus cooling effect may be enhanced. The scheme of the turbulator 45d is not limited thereto, however, on the contrary various patterns and shapes may be possible in alternative embodiments.

The sub cooling jacket 40 is provided with the second component 2 with relatively low heat generation. A second cooling pin 7 may be formed to protrude from the second component 2. In addition, the second component 2 may be mounted to the sub cooling jacket 40 (referring to FIG. 2) though heat interface material 71 (HIM). The heat interface material 71 may be a thermal pad or thermal grease which may transfer heat generated in the second component 2 to the sub cooling jacket 40.

Because the second component 2 is mounted to the sub cooling jacket 40 interposing the heat interface material 71 therebetween, the sub cooling jacket 40 indirectly cools the second component 2 via the coolant flowing though the sub cooling path 41.

Hereinafter, the operations of the cooling system for a conversion device 100 according to the exemplary embodiment of the present invention will be described referring to the drawings. In the exemplary embodiment of the present invention, the coolant flows into the main cooling path 21 through the main inlet 23 of the main cooling jacket 20 to cool the first and second components 1 and 2. Meanwhile, the coolant flowing through the main cooling path 21 flows into the sub cooling path 41 of the sub cooling jacket 40 through the sub inlet 61 of the heat sinking plane 60.

The coolant flowing into the sub cooling path 41 flows along the channels 45c and cools the second component 2 through the heat interface material 71 indirectly. The sub cooling path 41 may include the turbulators 45d and thus the coolant may contact a relatively large area in the channels 45c so that cooling efficiency may be enhanced. The coolant passing through the sub cooling path 41 is exhausted from the outlet 43 of the sub cooling jacket 40. Thus, in the exemplary embodiment of the present invention, the first component 1 with a relatively high heat generation is directly cooled by the main cooling jacket 20 and the second component 2 with a relatively low heat generation is indirectly cooled by the sub cooling jacket 40.

In an exemplary embodiment of the present invention, the cooling system for a conversion device 100 may cool the first and the second components 1 and 2 directly or indirectly depending upon the amount of heat generated by a particular component, thus efficient design of the conversion device may be realized. Also, in an exemplary embodiment of the present invention, the components 1 and 2 with various heat generations are cooled by coolant of a cooling module and thus the performance of the conversion device may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A cooling system for a conversion device comprising:
a heat sinking plane;
a main cooling jacket connected adjacently to a first side of the heat sinking plane and provided with a first component disposed thereto, wherein the main cooling jacket and the heat sinking plane define a main cooling path therebetween; and the first component directly contacts the coolant flowing through the main cooling path;
a sub cooling jacket connected adjacently to a second side of the heat sinking plane, and is provided with a second component which generates a relatively lower amount of heat than that of the first component wherein the second side of the heat sinking plane is the opposite side of the main cooling jacket,
wherein the sub cooling jacket and the heat sinking plane define a sub cooling path therebetween and the second component is indirectly cooled by the coolant flow through the sub cooling jacket via the sub cooling path,
wherein heat interface material is interposed between the sub cooling jacket and the second component;
a main inlet disposed in the main cooling jacket supplying coolant to directly cool the first component through the main cooling path; and
an outlet disposed in the sub cooling jacket exhausting the coolant to indirectly cool the second component through the sub cooling path,
wherein a sub inlet is formed in the heat sinking plane to allow the coolant passing through the main cooling path to be supplied to the sub cooling path.

2. The cooling system of claim 1, wherein an open aperture is formed to the main cooling jacket for the first component to directly contact the coolant.

3. The cooling system of claim 2, wherein the cooling system further comprises a first cooling pin formed to protrude from the first component,
wherein the first cooling pin directly contacts the coolant through the open aperture.

4. The cooling system of claim 1, wherein the sub cooling path communicates the sub inlet with the outlet and is formed in a "U" shape.

5. The cooling system of claim 4, wherein the sub cooling path comprises:

a first space communicated with the sub inlet; and
a second space communicated with the outlet.

6. The cooling system of claim 5, wherein the sub cooling path further comprises a plurality of channels connecting the first space and the second space.

7. The cooling system of claim 6, wherein the cooling system further comprises a turbulator formed in at least part of the plurality of channels.

8. The cooling system of claim 1, wherein the heat interface material is a thermal pad or thermal grease.

9. The cooling system of claim 3, wherein the cooling system further comprises a second cooling pin formed to protrude from the second component.

10. The cooling system of claim 1, wherein the conversion device includes an inverter or a converter for a vehicle.

11. The cooling system of claim 1, wherein:
the first component comprises switching elements; and
the second component comprises core elements.

12. A cooling system for a conversion device comprising:
a heat sinking plane;
a main cooling jacket connected with the heat sinking plane and provided with a first component disposed thereto;
a sub cooling jacket connected with the heat sinking plane on the opposite side of the main cooling jacket, and provided with a second component which produces a relatively lower amount of heat than the first component, wherein heat interface material is interposed between the sub cooling jacket and the second component;
a main inlet disposed in the main cooling jacket supplying coolant to the main cooling jacket; and
an outlet disposed in the sub cooling jacket exhausting the coolant which has passed through the sub cooling jacket,
wherein a sub inlet is formed in the heat sinking plane for the coolant passing through the main cooling jacket to be supplied to the sub cooling jacket,
the main cooling jacket and the heat sinking plane define a main cooling path therebetween,
the first component directly contacts the coolant flowing through the main cooling path, and
the sub cooling jacket and the heat sinking plane define a sub cooling path therebetween and the second component is in indirect contact with the coolant that flow through the sub cooling jacket via the sub cooling path.

13. The cooling system of claim 12, wherein:
an open aperture is formed to the main cooling jacket for the first component to directly contact the coolant,
a first cooling pin is formed to the first component, and
the first cooling pin directly contacts the coolant through the open aperture.

14. The cooling system of claim 12, wherein the sub cooling path communicates the sub inlet with the outlet and is formed in a "U" shape,
wherein the sub cooling path comprises:
a first space communicated with the sub inlet; and
a second space communicated with the outlet.

15. The cooling system of claim 14, wherein the sub cooling path further comprises a plurality of channels connecting the first space and the second space,
wherein a turbulator is formed in at least part of the plurality of channels.

* * * * *